United States Patent [19]
Ezell

[11] Patent Number: 6,100,761
[45] Date of Patent: Aug. 8, 2000

[54] HIGHLY LINEAR VARIABLE-GAIN LOW NOISE AMPLIFIER

[75] Inventor: Richard William Ezell, Carrolton, Tex.

[73] Assignee: Microtune, Inc., Plano, Tex.

[21] Appl. No.: 09/167,350

[22] Filed: Oct. 7, 1998

[51] Int. Cl.[7] .................................................. H03F 3/45
[52] U.S. Cl. ........................................ 330/254; 330/285
[58] Field of Search .................................. 330/254, 285, 330/129, 261, 252

[56] References Cited

U.S. PATENT DOCUMENTS

| | | | |
|---|---|---|---|
| 3,761,741 | 9/1973 | Hoeft | 307/237 |
| 4,929,908 | 5/1990 | Imanishi | 330/254 |
| 5,610,557 | 3/1997 | Jett, Jr. | 330/261 |

FOREIGN PATENT DOCUMENTS 2-100407  4/1990  Japan ..................................... 330/254

OTHER PUBLICATIONS

The Designer's Guide to Spice and Spectre; Kenneth S. Kundert; p. 255, 1995.

*Primary Examiner*—Robert Pascal
*Assistant Examiner*—Henry Choe
*Attorney, Agent, or Firm*—Fulbright & Jaworski L.L.P.

[57] ABSTRACT

A highly linear variable-gain low noise amplifier is constructed using a transistor pair having variable gain control. The gain of the transistor pair is achieved by a segmented resistor having controllable PMOS (or NMOS) components. The circuit includes a variable voltage source and operates to handle wideband radio transmissions via broadcast or cable.

32 Claims, 3 Drawing Sheets

HIGHLY LINEAR VARIABLE-GAIN LOW NOISE AMPLIFIER

TECHNICAL FIELD OF THE INVENTION

This invention relates to amplifier circuits and to amplifiers which are used in tuners and even more specifically to such amplifiers where variable-gain low noise amplification is required.

BACKGROUND OF THE INVENTION

U.S. Pat. No. 5,737,035 dated Apr. 7, 1998, shows a tuner circuit. The front end of such a tuner requires a broadband, highly linear Variable-gain Low Noise Amplifier (VLNA). The VLNA's input comes from either an antenna for wireless broadcasts or from a coaxial cable for cable transmission. The output of the VLNA supplies the input of the first up-converting mixer. The noise figure specification for the VLNA is highly critical, and has the highest impact on the overall noise figure of the system. Non-linearities of the amplifier also have a large effect on the proper operation of the tuner.

LNA's are typically used to meet cellular requirements, which are narrow-band. However, a television tuner must receive carriers from 50 MHZ to over 860 MHz. A narrow bandwidth system also has less stringent linearity specifications because fewer intermodulation distortion products fall in-band. Finally, because the incoming signal power to a tuner can vary by many orders of magnitude, there is a need for an LNA whose gain is continuously-variable. The gain variability function adds noise, distortion, and complexity to the LNA.

Accordingly, there exists a need in the art for a low noise amplifier which can handle a wide frequency range as well as a wide amplification range.

A further need exists in the art for such a circuit which can be constructed on a single substrate and which will not be effected by, nor produce, noise injection.

SUMMARY OF THE INVENTION

These and other objects, features and technical advantages are achieved by a system and method which meets the noise, linearity, and gain ranges required in wide band tuners by using a segmented resistor and MOS structure in the signal path to vary the gain of a bipolar (or MOS) transistor amplifier. The system includes a method for both biasing the device and controlling the gain using a differential voltage input. Both PMOS, and NMOS transistors are used and operated in their triode mode to preserve linearity and low noise. The circuit operates for transmission signals received via air wave broadcast or via cable and can handle wide ranges of amplification requirements as well as intermodulation constraints.

It is a technical feature of my invention to provide a VLNA which utilizes a pseudo differential structure to reduce the effects of on-chip substrate injection and supply line fluctuations.

It is another technical feature of my invention to provide a circuit where the gain of the amplifier changes in a linear and predictable fashion with the controlling voltage input.

It is a further technical feature of my invention that such a circuit is constructed to produce a large gain range, having low noise, capable of operating across a wide band-width.

It is a further technical feature of my invention to provide such a circuit and method which is self biasing.

It is a further technical feature of my invention to provide such a circuit which will operate with circuits which require either a high constant output intercept or a high constant input intercept.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE INVENTION

Figure 1:
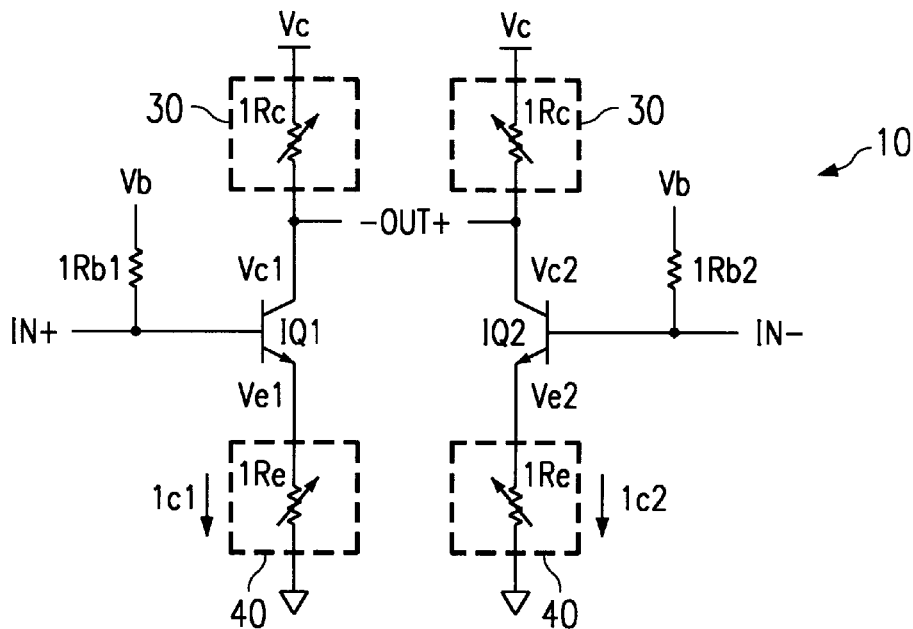
FIG. 1 shows the overall bipolar transistor circuit of the amplifier.

The preferred embodiment of the invention employs a variation of a resistively-loaded NPN transconductance pair, 10, which includes transistors 1Q1 and 1Q2, as seen in FIG. 1. As shown, both 1 Re and 1 Rc are continuously variable, to change the overall gain of the block. The voltage gain, A, is given by Equation 1, where "gm" refers to the transconductance of transistors 1Q1 and 1Q2.

$$A = \frac{1Rc}{1/gm + 1Re} \qquad \text{(Eq. 1)}$$

As can be seen, if the gm of the transistors is high enough, A is set by 1 Rc/1 Re. This allows the gain to be affected by varying either of these quantities, depending on specific desired qualities.

To reach maximum gain (Amax), resistor 1 Rc is placed at its maximum value and resistor 1 Re at its minimum. Gain reduction from Amax is accomplished by first increasing 1 Re and then decreasing 1 Rc. Varying these resistances produces other effects, as well.

For a given bias current through transistors 1Q1 and 1Q2, increasing 1 Re decreases gain. Additionally, the Third-order Output Intercept Point (OIP3), which is a chief measure of linearity, remains relatively unaffected, while the Third-order Input Intercept Point (IIP3) increases. The noise figure of the device increases approximately one-half dB per dB of gain decrease.

Decreasing 1 Rc decreases gain for a given bias current, and also reduces OIP3. However, IIP3 remains constant, while the noise figure increases a full dB per dB of gain decrease.

Figure 2:
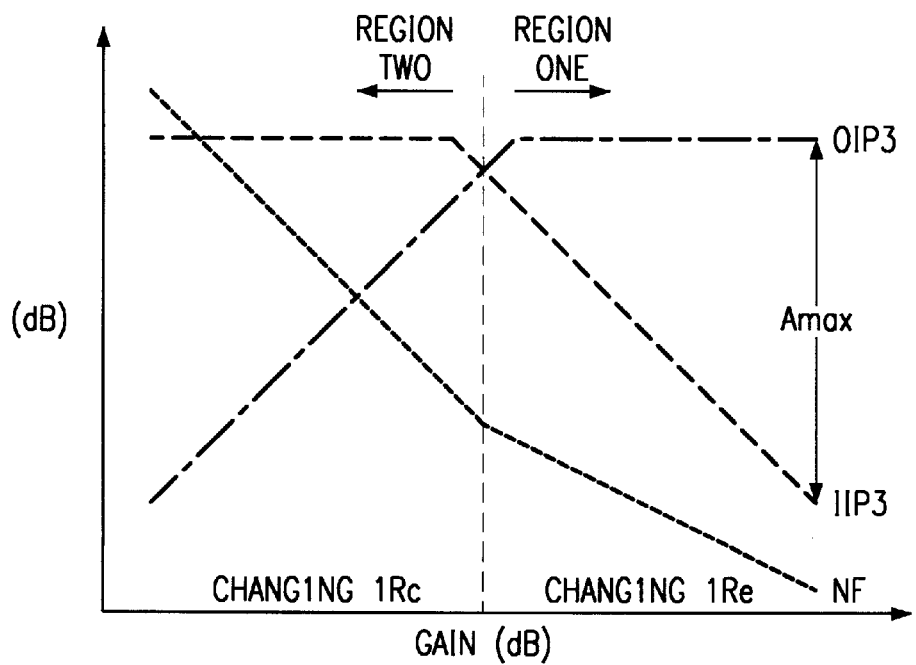
FIG. 2 is a graph showing the effects of varying the effective resistances of the circuit of FIG. 1.

As can be seen in FIG. 2, these behaviors cause distinctly different operating characteristics, depending on the gain selected. Region One behavior is exhibited while changing 1 Re, while Region Two has 1 Rc changing.

These two regions define two different applications for the tuner system as a whole. When the VLNA is supplied by a cable system, a multitude of carriers exist at its input, each with a similar limited power range. These multiple signals cause a large number of possible cross-modulated products, requiring very high output linearity, or OIP3, in the amplifier. Region One is defined such that it encompasses the range of power supplied from different cable systems.

When the VLNA is fed by an antenna, the amplifier must deal with far fewer carriers which are typically tightly regulated as to channel spacing and power, such that channel-to-channel interference is reduced thereby reducing the need for high linearity in the front end. A single channel, however, may contain much higher power than would be seen in a cable system thereby requiring a much lower level of gain. In this case the noise figure may be degraded by a larger amount, but a larger input linearity, or IIP3, must be maintained to avoid input compression. Region Two shows these characteristics.

The above observations about input and output intercept show general trends that will occur if the 1 Rc and 1 Re resistances are varied linearly, and if the resistors themselves remain non-distortive. The distortion due to the non-constant gm of the bipolar transistors will then dominate. However, anything with a transconductance that can be changed, i.e. 1 Rc and 1 Re, will be an active device, and have non-linearities of its own which must be controlled. While simple in concept, changing 1 Rc and 1 Re in an analog and predictable manner is quite difficult. As will be discussed in more detail hereinafter, the circuit uses a network of resistors and MOS devices to overcome this difficulty.

Figure 3:
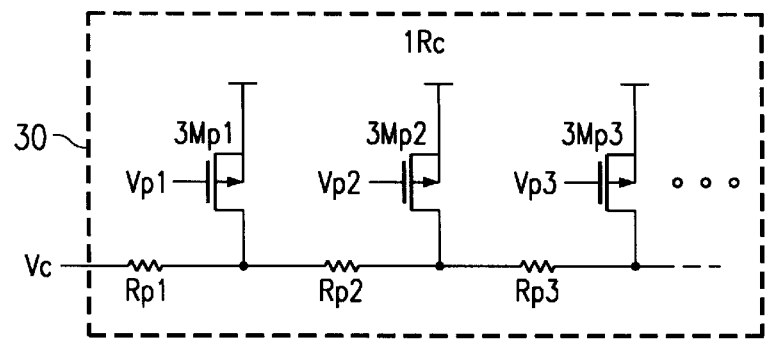
FIGS. 3 and 4 show the details of the segmented resistors of FIG. 1.
Figure 4:
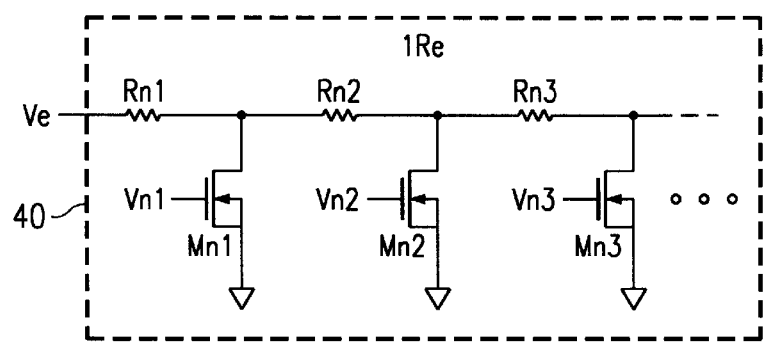

FIGS. 3 and 4 illustrate a preferred embodiment of resistors 1 Rc and 1 Re, respectively, which are variable, highly linear resistors. The nodes "Ve" and "Vc" correspond to the respective points in FIG. 1. The control voltages Vp1, Vp2, Vp3, change the effective resistance of 1 Rc, by changing the gate voltages of PMOS devices 3M$p$1, 3M$p$2, 3M$p$3, etc., and voltages Vn1, Vn2, Vn3, etc., likewise control 1 Re (FIG. 4). All subsequent discussion will describe 1 Re, which uses NMOS transistors. The operation of 1 Rc (FIG. 3) may be understood by inverting the sense of the described control voltages Vp1, Vp2, Vp3, etc. (discussed with respect to FIGS. 6 and 7).

To set 1 Re to its minimum resistance, all of the Vnx (when x can be any number 1, 2, 3, etc.) control lines are set to the highest available voltage. Due to bias conditions on Ve and the choice of values of Rnx, all of the MOS devices will be in a triode mode of operation. This gives a predictable drain-to-source resistance, inversely proportional to the gate voltage. Equation 2 provides a first order approximation of the equivalent resistance Rds provided by an NMOS, where Vth is the threshold voltage of the device, and C is a constant depending on process and transistor geometry.

$$Rds = \frac{1}{C*(Vnx - Vth)} \quad \text{(Eq. 2)}$$

The resistance of 1 Re is increased by changing the Vnx control lines in a successive manner. First, Vn1 is gradually reduced, then Vn2, then Vn3, etc., so as to reduce the voltage Vnx thereby increasing the effective resistance of the MOS device. But, the overall resistance is also affected by resistor Rnx, which has several effects. By limiting the contribution of total resistance of the MOS devices, it reduces the sensitivity of resistor 1 Re to the control voltage, reduces the effect of the MOS's nonlinearity, and helps confine the transistors to the triode mode of operation.

Figure 6:
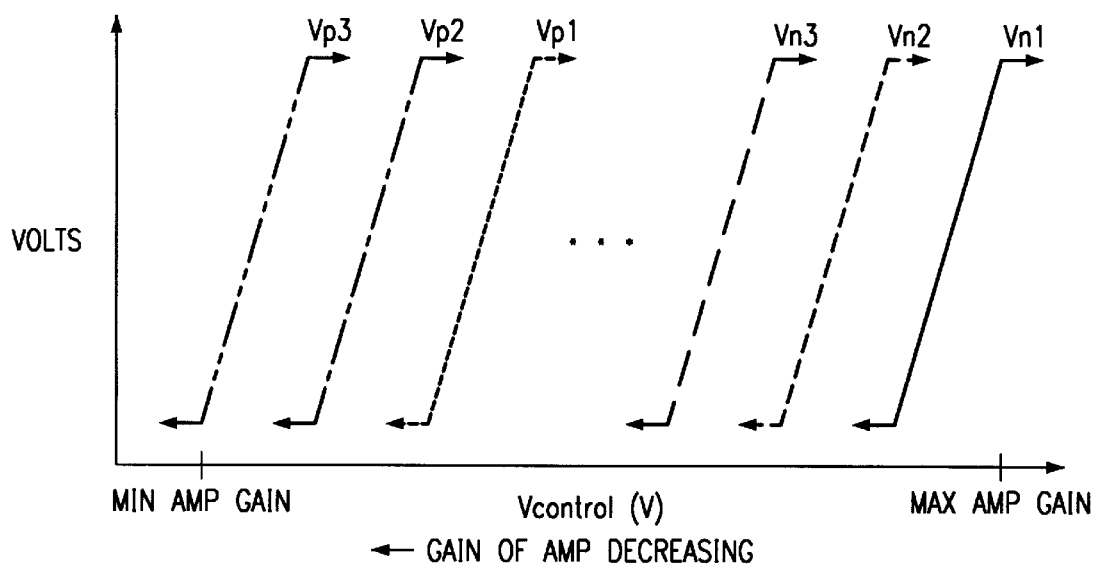
FIG. 6 shows a graph of control voltage versus differential control voltage input (gain control)

FIG. 6 shows the method of changing the Vnx control lines. 1 Re's resistance is increased by changing the Vnx control lines in a successive manner. When reducing the amplifier's gain from its maximum point, first Vn1 is gradually reduced, then Vn2, then Vn3, etc., continually increasing 1 Re's effective resistance. 1 Rc's effective resistance is decreased after 1 Re reaches its effective maximum by subsequently reducing the Vpx control lines. FIG. 6 illustrates the response of the gain control circuitry to a differential control voltage.

Figure 7:
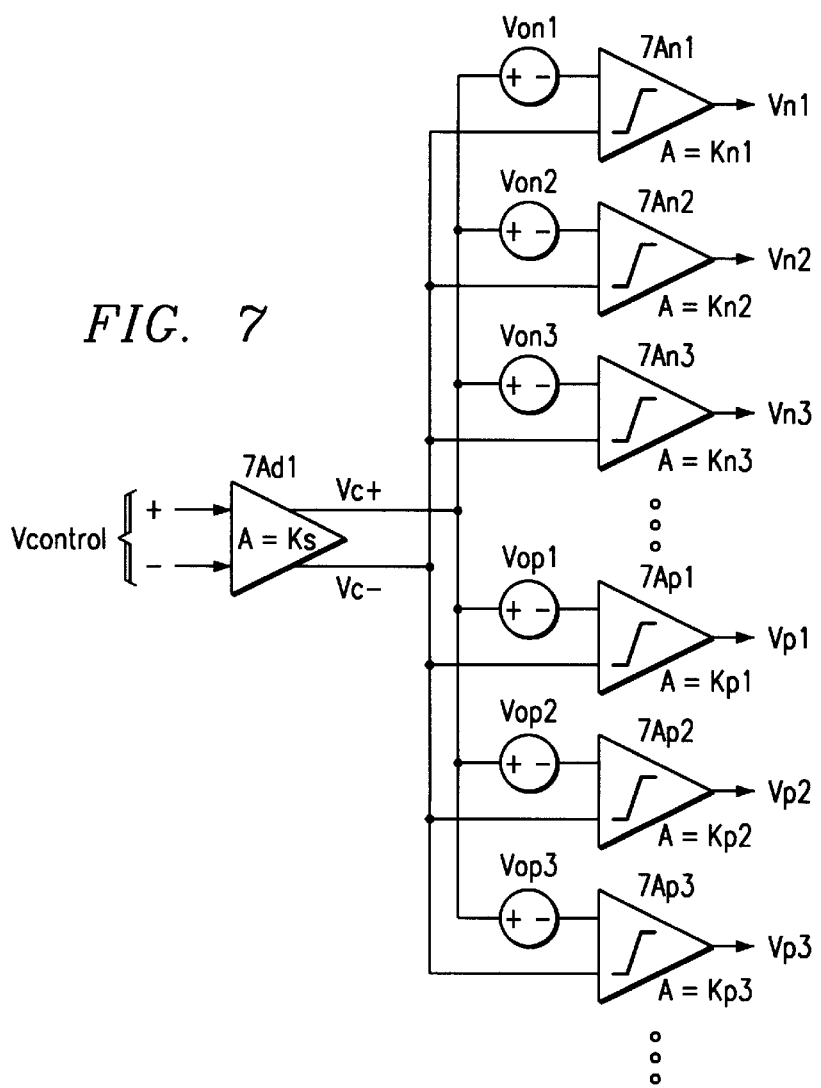
FIG. 7 shows the circuitry to accomplish the voltages shown in FIG. 6.

FIG. 7 shows a simplified diagram of the control circuitry for the voltages show in FIG. 6. As shown, the control signal is applied to a fully differential amplifier 7 A$d$1 with gain Ks, which produces signal Vc. Amplifier 7 A$d$1 sets the sensitivity of the VLNA's gain to the applied differential control voltage Vcontrol. A larger Ks makes the VLNA's gain more sensitive with respect to Vcontrol.

Control voltage Vc is then distributed to separate amplifiers, 7 A$n$1 to 7 A$p$3, each controlling a Vnx or Vpx control line contained in the VLNA amplifier core. Each amplifier has an individual input offset voltage represented by a discrete voltage source at its input. The offset voltages are increased successively, starting with amplifier 7 A$n$1 and offset voltage Von1, and ending with amplifier 7 A$p$3 with offset Vo$p$3. The gradually increasing offset voltages set the point where each control line will begin to change, or "breaks".

Also note that each amplifier has an individual gain Knx or Kpx, which sets the slope of the corresponding control line Vnx or Vpx during its transition. The amplifiers have a high output swing (from ground to Vcc) to correctly drive the MOS gates they control.

Returning now to FIG. 1, the steady-state bias current 1$c$1 and 1$c$2 through transistors 1Q1 and 1Q2 is determined by the value of 1 Re and the voltage applied at Vb. If Vb is set to a constant value, 1$c$1 will be reduced as 1 Re is increased. This would further reduce the gain of the amplifier (gm would decrease) and reduce OIP3. To keep a constant OIP3, a constant bias current must be maintained. As a result, when changing 1 Re, Vb must be changed appropriately.

Figure 5:
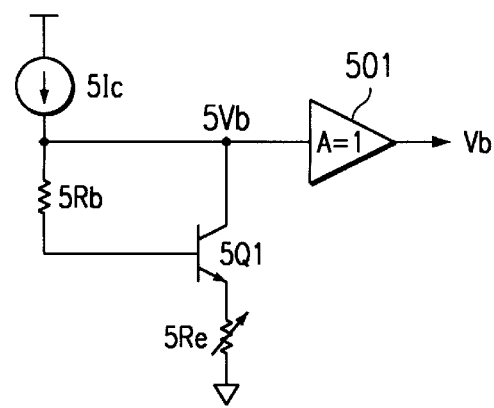
FIG. 5 shows the details of the variable voltage source used with FIG. 1.

FIG. 5 shows the circuit which generates voltage Vb. Resistors 5R$b$, 5R$e$ and transistor 5Q1 are sized to match similar components in the circuit of FIG. 1. Current 5$1c$ is the desired bias current. The actual current 1$c$1 and 1$c$2 may differ slightly due to matching of the devices. Buffer amplifier 501 drives Vb, with 5V$b$as its input.

Although the present invention and its advantages have been described in detail, it should be understood that various changes, substitutions and alterations can be made herein without departing from the spirit and scope of the invention as defined by the appended claims.

What is claimed is:

1. A linear variable gain amplifier for use in a RF tuner, said amplifier comprising:

a pair of transistors; and means for adjusting a current flow through the transistor circuit path so as to vary the gain of said amplifier, while maintaining either a Third-order Output Intercept Point (OIP3) or a Third-order Input Intercept Point (IIP3) of said amplifier at a constant level, said means for adjusting including means for sequentially adding into said circuit path of said transistors an impedance value including one or more resistors, each said resistor having associated therewith a MOS device operable for changing the effective resistance of said associated resistor.

2. The amplifier of claim 1 wherein said sequentially adding means includes:

means for varying the gate voltage of said MOS device to control the effective resistance of said device.

3. The amplifier of claim 2 wherein said transistor pair is a bipolar transistor pair and wherein said circuit path includes both the emitter path and the collector path and wherein said sequentially adding step includes:

means for selecting into which path said impedance is to be added.

4. The amplifier of claim 2 wherein said transistor pair is a MOS transistor and wherein said circuit path includes both the source path and the drain path and wherein said sequentially adding step includes:

means for selecting into which path said impedance is to be added.

5. The amplifier of claim 1 wherein said amplifier is capable of handling a wide range of input frequencies.

6. The amplifier of claim 5 wherein said wide range is 50–860 MHZ.

7. An amplifier capable of operating in either a first region where high output linearity is required or in a second region where a high input linearity is required, said amplifier comprising:

a transconductance stage, wherein said transconductance stage is a pair of transistors;

a first controllable impedance selectively variable within a range to operate said amplifier in said first region;

a second controllable impedance selectively variable within a range to operate said amplifier in said second region, wherein said first and second impedances are pairs of impedances respectively connected to said pair of transistors; and a plurality of transistors for controlling the effective values of said first and second impedances, wherein said plurality of transistors are MOS devices.

8. The amplifier in claim 7 wherein said impedance is resistive.

9. The amplifier in claim 7 further including circuitry to bias said amplifier.

10. The amplifier in claim 7 wherein said first region is capable of amplifying signals received over a cable and wherein said second region is capable of amplifying signals received from a broadcast reception antenna.

11. An amplifier capable of operating in either a first region where high output linearity is required or in a second region where a high input linearity is required, said amplifier comprising:

a transconductance stage, wherein said transconductance stage is a pair of transistors;

a first controllable impedance selectively variable within a range to operate said amplifier in said first region, wherein said transistor pair is a bipolar transistor pair and wherein said first impedance is connected in the emitter circuits of said transistor pair;

a second controllable impedance selectively variable within a range to operate said amplifier in said second region, wherein said second impedance is connected in the collector circuits of said transistor pair; and a plurality of transistors for controlling the effective values of said first and second impedances, wherein said plurality of transistors are MOS devices.

12. The amplifier in claim 11 wherein said first and second impedances are pairs of impedances respectively connected to said pair of transistors.

13. The amplifier in claim 11 further including circuits for varying the gate voltage of said MOS devices to control the effective impedance of said controllable impedance.

14. The amplifier in claim 11 wherein said impedance is resistive.

15. The amplifier in claim 11 further including circuitry to bias said amplifier.

16. The amplifier in claim 11 wherein said first region is capable of amplifying signals received over a cable and wherein said second region is capable of amplifying signals received from a broadcast reception antenna.

17. An amplifier capable of operating in either a first region where high output linearity is required or in a second region where a high input linearity is required, said amplifier comprising:

a transconductance stage, wherein said tansconductance stage is a pair of transistors;

a first controllable impedance selectively variable within a range to operate said amplifier in said first region, wherein said transistor pair is a MOS transistor pair and wherein said first impedance is connected in the source path of said MOS transistor pair;

a second controllable impedance selectively variable within a range to operate said amplifier in said second region, wherein said second impedance is connected in the drain path of said MOS transistor pair; and a plurality of transistors for controlling the effective values of said first and second impedances, wherein said plurality of transistors are MOS devices.

18. The amplifier in claim 17 wherein said first and second impedances are pairs of impedances respectively connected to said pair of transistors.

19. The amplifier in claim 17 further including circuits for varying the gate voltage of said MOS devices to control the effective impedance of said controllable impedance.

20. The amplifier in claim 17 wherein said impedance is resistive.

21. The amplifier in claim 17 further including circuitry to bias said amplifier.

22. The amplifier in claim 17 wherein said first region is capable of amplifying signals received over a cable and wherein said second region is capable of amplifying signals received from a broadcast reception antenna.

23. An amplifier capable of operating in either a first region where high output linearity is required or in a second region where a high input linearity is required, said amplifier comprising:

a transconductance stage;

a first controllable impedance selectively variable within a range to operate said amplifier in said first region;

a second controllable impedance selectively variable within a range to operate said amplifier in said second region;

a plurality of transistors for controlling the effective values of said first and second impedances, wherein said plurality of transistors are MOS devices; and circuits for varying the gate voltage of said MOS devices to control the effective impedance of said controllable impedance.

24. The amplifier in claim 23 wherein said transconductance stage is a pair of transistors.

25. The amplifier in claim 24 wherein said first and second impedances are pairs of impedances respectively connected to said pair of transistors.

26. The amplifier in claim 24 wherein said transistor pair is a bipolar transistor pair and wherein said first impedance is connected in the emitter circuits of said transistor pair.

27. The amplifier in claim 26 wherein said second impedance is connected in the collector circuits of said transistor pair.

28. The amplifier in claim 24 wherein said transistor pair is a MOS transistor pair and wherein said first impedance is connected in the source path of said MOS transistor pair.

29. The amplifier in claim 28 wherein said second impedance is connected in the drain path of said MOS transistor pair.

30. The amplifier in claim 23 wherein said impedance is resistive.

31. The amplifier in claim 24 further including circuitry to bias said amplifier.

32. The amplifier in claim 23 wherein said first region is capable of amplifying signals received over a cable and wherein said second region is capable of amplifying signals received from a broadcast reception antenna.

* * * * *